(12) United States Patent
Huang (10) Patent No.: US 8,689,598 B2
(45) Date of Patent: Apr. 8, 2014

(54) METHOD OF FORMING A TENON ON ONE SIDE OF A METAL PLATE MEMBER

(75) Inventor: Joseph Huang, Taoyuan (TW)

(73) Assignee: Ho E Screw & Hardware Co., Ltd., Taoyuan (TW)

( * ) Notice: Subject to any disclaimer, the term of this patent is extended or adjusted under 35 U.S.C. 154(b) by 679 days.

(21) Appl. No.: 12/646,956

(22) Filed: Dec. 23, 2009

(65) Prior Publication Data

US 2011/0011146 A1 Jan. 20, 2011

(30) Foreign Application Priority Data

Jul. 20, 2009 (TW) .............................. 98124371 A (51) Int. Cl.
*B21D 31/02* (2006.01)
(52) U.S. Cl.
USPC .............................. 72/325; 72/379.2; 72/356
(58) Field of Classification Search
USPC ......... 72/31.13, 60, 76, 259, 267.1, 264, 324, 72/325, 347–349, 353.2, 354.2, 354.6, 72/354.8, 355.4, 352.2, 253.2, 379.2, 359, 72/334, 352, 356, 358, 356.6, 333; 439/138, 142, 136, 147; 29/890, 557, 29/432.2, 34 B, 558; 83/558, 621; D14/411, 433
See application file for complete search history.

(56) References Cited

U.S. PATENT DOCUMENTS

| 4,580,431 | A | * | 4/1986 | Oku et al. ........................ 72/334 |
| 5,572,305 | A | * | 11/1996 | Hayashi et al. ............... 399/121 |
| 5,752,305 | A | * | 5/1998 | Cotterill et al. .............. 29/432.2 |
| 6,151,777 | A | * | 11/2000 | Sakuraba ................. 29/890.144 |
| 6,189,199 | B1 | * | 2/2001 | Ouchi et al. ..................... 29/557 |
| 6,591,657 | B1 | * | 7/2003 | Kato ............................... 72/398 |

FOREIGN PATENT DOCUMENTS

| JP | 4-200833 | * | 7/1992 | .................. 72/354.8 |
| JP | 4200833 | * | 7/1992 | .................. 72/354.8 |

* cited by examiner

*Primary Examiner* — Shelley Self
*Assistant Examiner* — Mohammad Nourbakhsh
(74) *Attorney, Agent, or Firm* — Guice Patents PLLC (57) ABSTRACT

A method of forming a tenon on one side of a metal plate member by means of punching the wall of one side of the metal plate member with a punch or punches to form a protrusion and then punching the protrusion with a punch rod to extend the height of the protrusion and to deform the protrusion into a tubular configuration.

16 Claims, 12 Drawing Sheets

METHOD OF FORMING A TENON ON ONE SIDE OF A METAL PLATE MEMBER

BACKGROUND OF THE INVENTION

1. Field of the Invention

The present invention relates to a tenon formation method and more particularly, to a method of forming a tenon on one side of a metal plate member that has a relatively greater height to fit different design applications, more particularly the fabrication of a mobile memory stick.

2. Description of the Related Art

Figure 7:
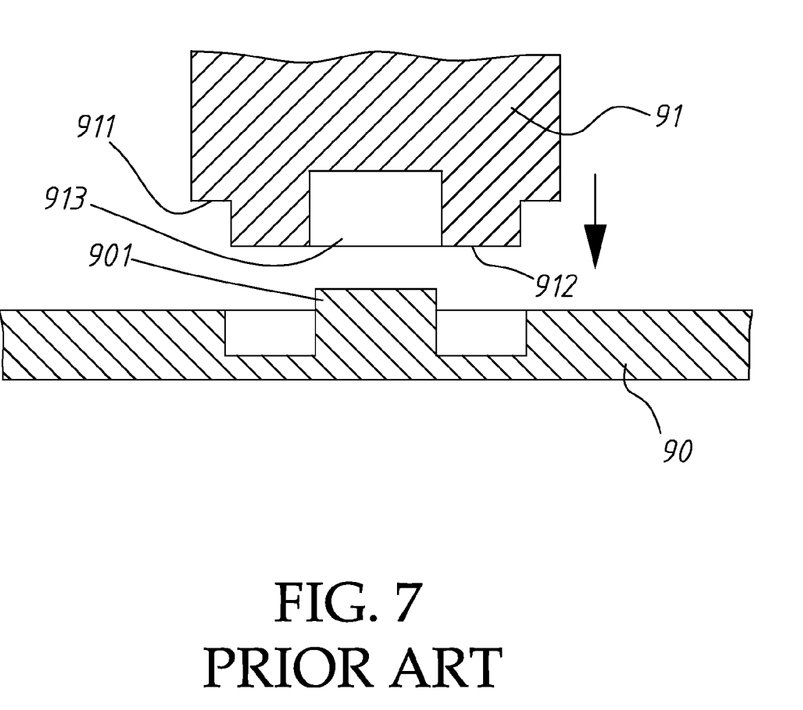
FIG. 7 is a schematic drawing showing the formation of a tenon on a metal plate member according to the prior art.

Forming a tenon on one side of a metal plate member for the connection of a swivel member is a pivot joint technique. During formation of this tenon, the other side of the metal plate member must be kept smooth without deformation. A conventional tenon formation method, as shown in FIG. 7, is the use of a punch to punch a metal plate member 90, thereby forming a tenon 901.

The punch 91 has an outer step 911, an inner step 912 and a recess 913 at the center of the inner step 912. When punching the metal plate member 90 with the punch 91, the inner step 912 will be driven into the wall of the corresponding side of the metal plate member 90, causing a part of the metal plate member 90 to be deformed into the desired tenon 901 by the recess 913.

This method can form an upwardly protruding tenon 901 at one side of the metal plate member 90, however the finished tenon 901 has a limited height. After installation, the connected member may fall from the tenon 901 accidentally.

Figure 8:
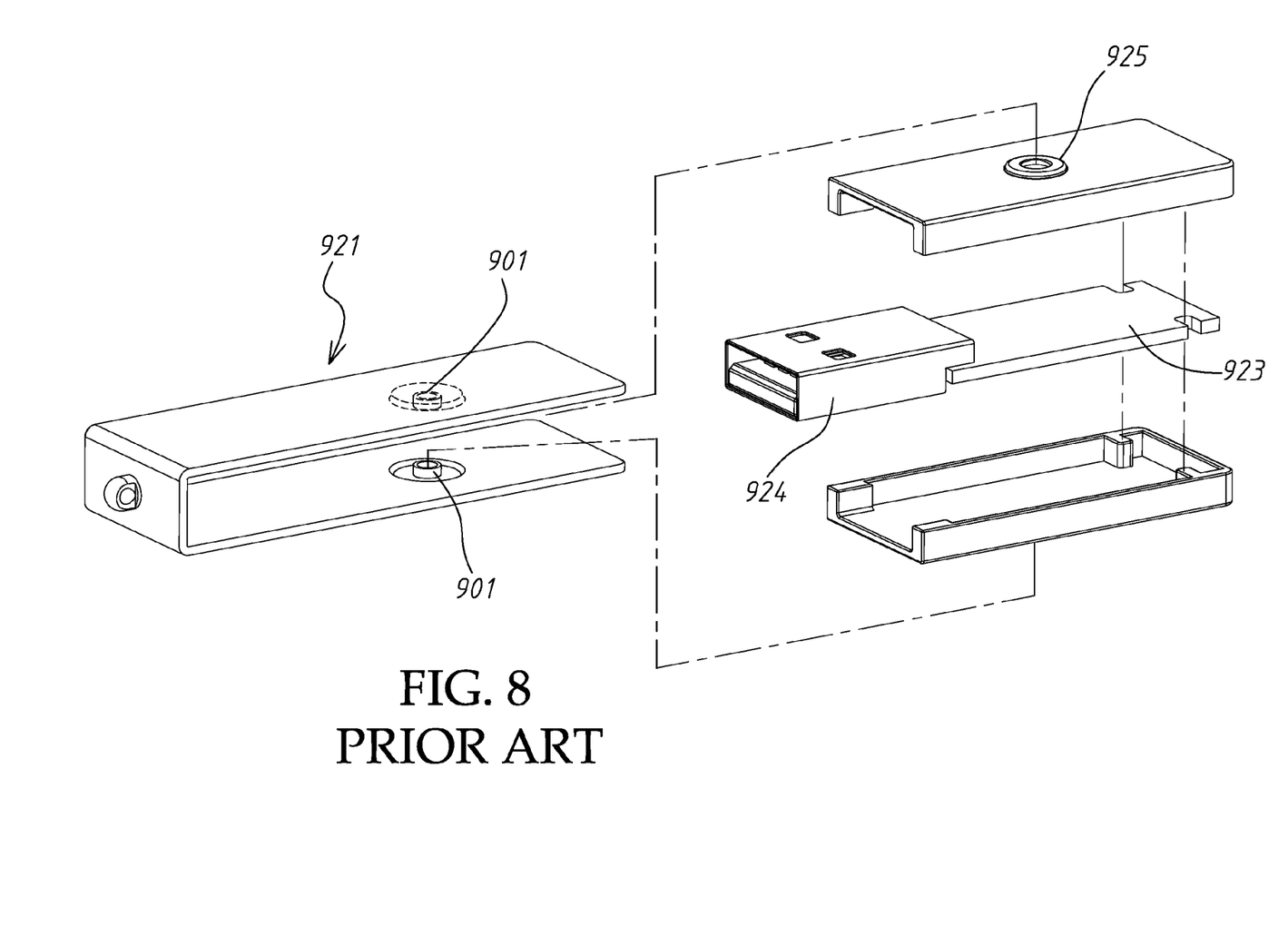
FIG. 8 is an exploded view of a mobile memory stick according to the prior art.
Figure 9:
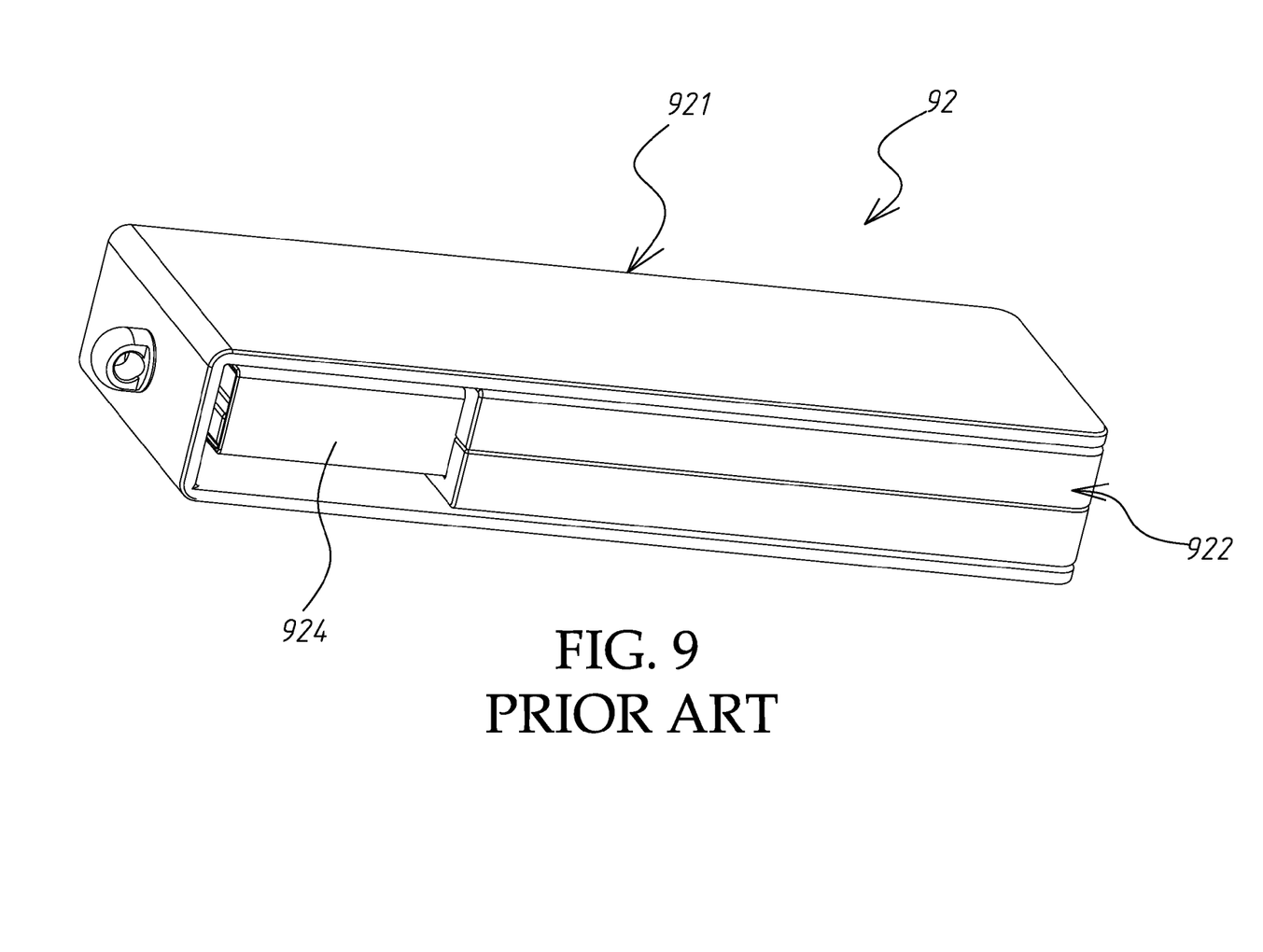
FIG. 9 is an elevational assembly view of the mobile memory stick according to the prior art.
Figure 10:
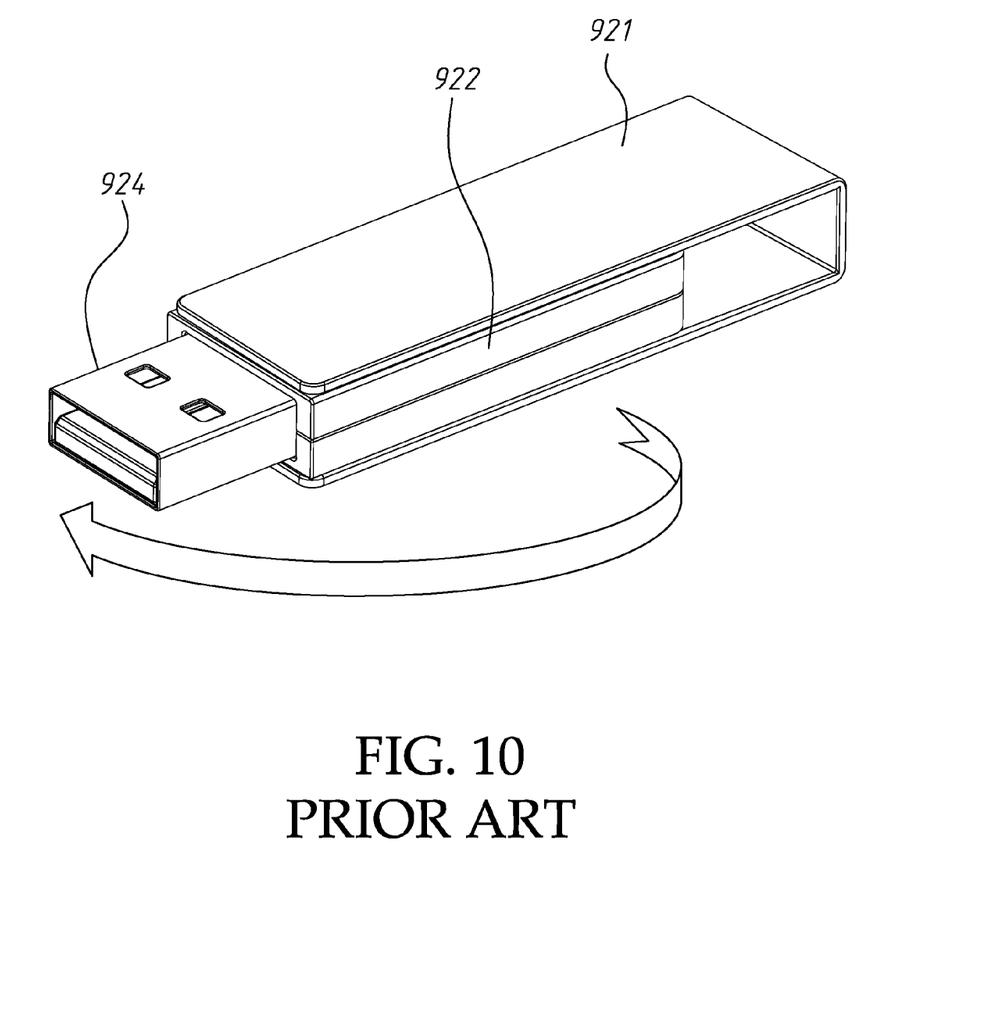
FIG. 10 is a schematic drawing showing an operation status of the mobile memory stick according to the prior art.

FIGS. 8~10 show an application example of the aforesaid tenon 901 in a swivel type mobile memory stick. As illustrated, the swivel type mobile memory stick 92 comprises an inverted U-shaped metal plate member 921 and a casing 922. The casing 922 accommodates a PC board 923 that has a USB connector 924 located on one end and extended out of the casing 922. The inverted U-shaped metal plate member 921 has two tenones 901 protruded from the inner wall thereof at two opposite sides and respectively pivotally connected to a respective pivot holder 925 on the casing 922 such that the inverted U-shaped metal plate member 921 is turnable relative to the casing 922 between a close position and an open position to close or open the USB connector 924, as shown in FIGS. 9 and 10.

According to this design, the tenones 901 have a limited height. Thus, the connection area between the tenones 901 of the inverted U-shaped metal plate member 921 and the pivot holders 925 of the casing 922 is limited, as shown in FIGS. 8-10, and therefore, the tenones 901 of the inverted U-shaped metal plate member 921 tend to be forced away from the pivot holders 925 of the casing 922 accidentally. An improvement in this regard is necessary.

SUMMARY OF THE INVENTION

The present invention has been accomplished under the circumstances in view. It is one object of the present invention to provide a tenon formation method, which employs a first punching technique to form a protrusion on the wall of one side of a metal plate member and then to deform the protrusion into a tubular configuration by means of a second punching technique.

Further, the tenon can be formed by means of the application of one single punch or two punches.

Further, the tenon thus formed can have a circular or non-circular cross section.

Further, the tenon can be further tapped to provide an inner thread.

Further, the tenon can be inserted through a swivel member and then hammered down to form a head, enabling the swivel member to be pivotally secured to the tenon.

Further, the invention provides a mobile memory stick formed of an inverted U-shaped metal plate member and a casing. The inverted U-shaped metal plate member has two tenones respectively protruded from an inner wall thereof at two opposite sides and aimed at each other. The tenones are formed on the inner wall of the inverted U-shaped metal plate member by punching the inner wall of the inverted U-shaped metal plate member with punch means to form a protrusion and then punching the protrusion with a punch rod to deform the protrusion into a tubular configuration. The casing accommodates a PC board having a USB connector extending out of the casing. The casing is set in the inverted U-shaped metal plate member, having two pivot holders symmetrically located on two opposite sides thereof and respectively pivotally coupled to the tenones of the inverted U-shaped metal plate member for enabling the inverted U-shaped metal plate member to be turned relative to the casing between a close position where the inverted U-shaped metal plate member closes the USB connector and an open position where the USB connector is opened from the inverted U-shaped metal plate member.

DETAILED DESCRIPTION OF THE PREFERRED EMBODIMENT

Figure 1A:
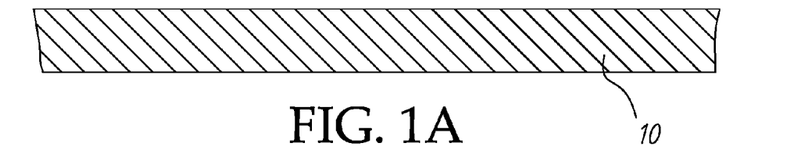
FIGS. 1A~1C illustrate a method of forming a tenon on one side of a metal plate member in accordance with a first embodiment of the present invention.
Figure 1B:
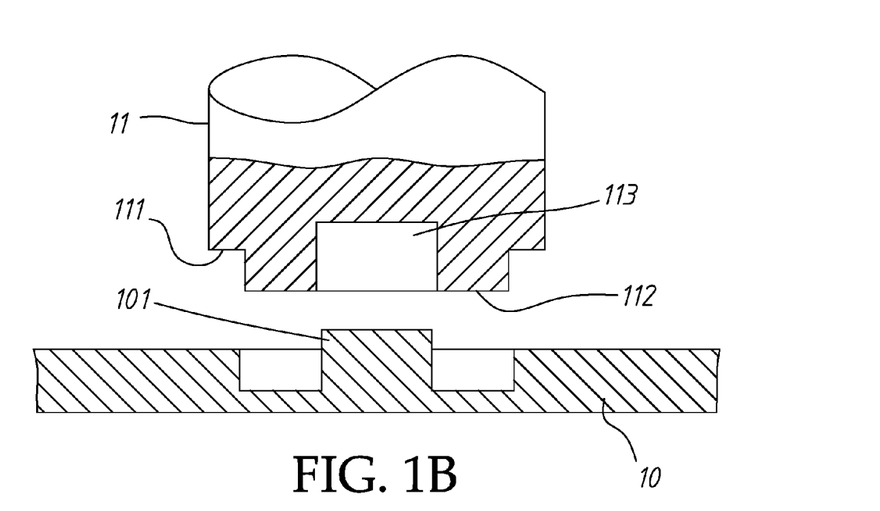
Figure 1C:
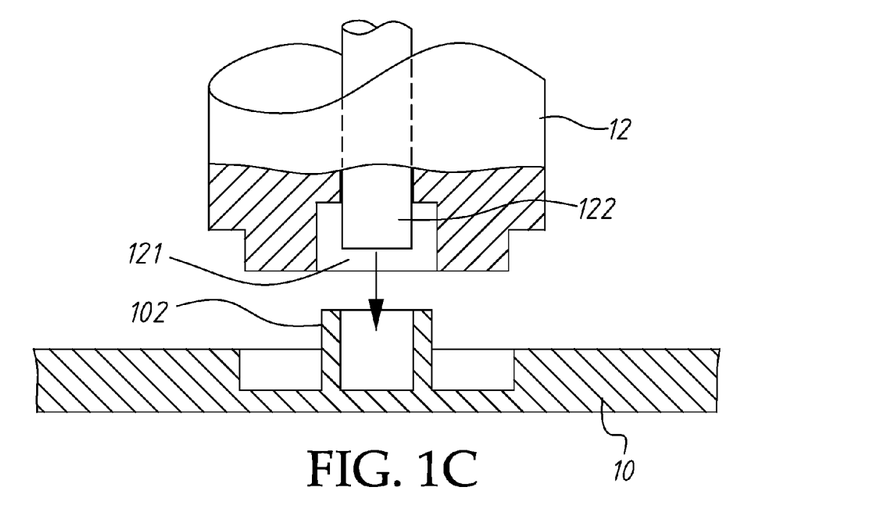
Figure 3:
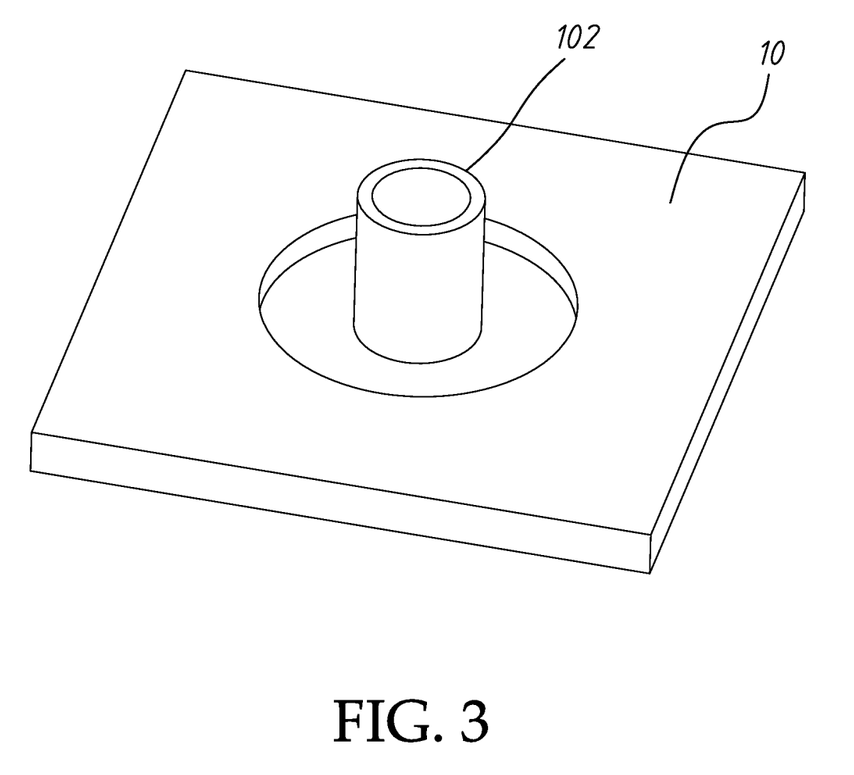
FIG. 3 is an elevational view, showing a circular tenon formed on one side of a metal plate member according to the present invention.

Referring to FIGS. 1A~1C, a method of forming a tenon on one side of a metal plate member in accordance with a first embodiment of the present invention includes the steps of:

a) providing a metal plate member 10;

b) providing a first punch 11 having an outer step 111, an inner step 112 perpendicularly protruded from the outer step 111 and a first recess 113 at the center of the inner step 112;

c) punching one side of the metal plate member 10 with the first punch 11 to drive the inner step 112 into the wall of the corresponding side of the metal plate member 10, causing a part of the wall of the corresponding side of the metal plate member 10 to be deformed into a protrusion 101 by the recess 113;

d) providing a second punch 12 that is prepared subject to the configuration of the surface area of the metal plate member 10 around the protrusion 101 and has a second recess 121 fitting the protrusion 101 and a punch rod 122 axially inserted through and movable up and down relative to the second recess 121; and e) punching the protrusion 101 of the metal plate member 10 with the second punch 12 and the punch rod 122 to extend the height of the protrusion 101 and to make the protrusion 101 into a tubular configuration, so that a tenon 102 is formed on one side of the metal plate member 10, as shown in FIG. 3.

Figure 2A:
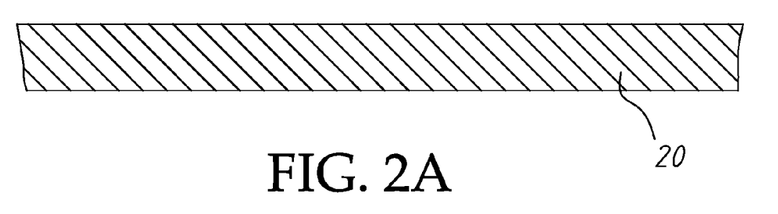
FIGS. 2A~2C illustrate a method of forming a tenon on one side of a metal plate member in accordance with a second embodiment of the present invention.
Figure 2B:
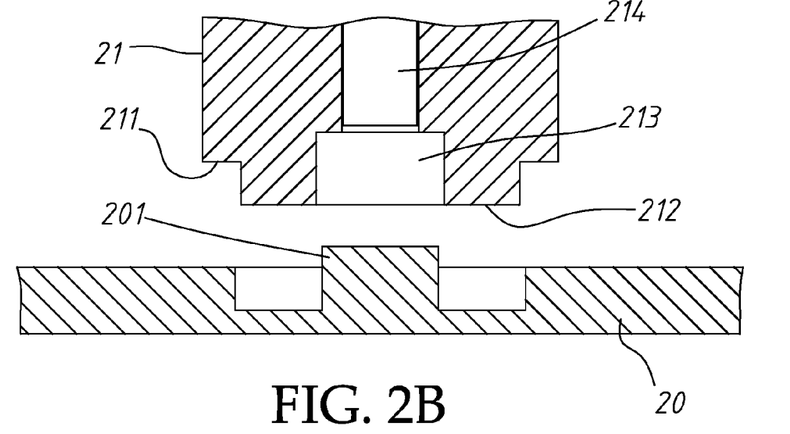
Figure 2C:
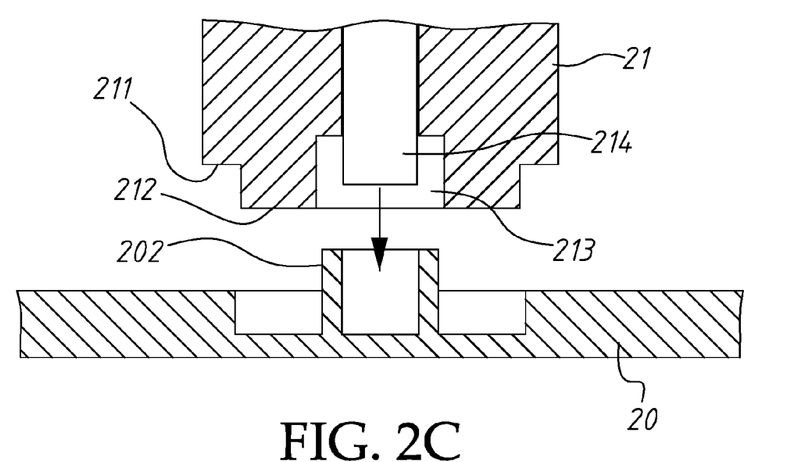

According to a second embodiment of the present invention, one single punch can be used to complete the aforesaid two punching steps, thereby forming a tenon on one side of a metal plate member, as shown in FIGS. 2A~2C. According to this second embodiment, the method of forming a tenon on one side of a metal plate member in accordance with the second embodiment of the present invention includes the steps of:

a) providing a metal plate member 20;

b) providing a punch 21 having an outer step 211, an inner step 212 perpendicularly protruded from the outer step 211, a recess 213 disposed at the center of the inner step 212 and a punch rod 214 axially inserted through and movable up and down relative to the recess 213;

c) punching one side of the metal plate member 20 with the punch 21 to drive the inner step 212 into the wall of the corresponding side of the metal plate member 20, causing a part of the wall of the corresponding side of the metal plate member 20 to be deformed into a protrusion 201 by the recess 213;

d) punching the protrusion 201 with the punch rod 214 to extend the height of the protrusion 201 and to make the protrusion 201 into a tubular configuration, so that a tenon 202 is formed on one side of the metal plate member 20.

According to the aforesaid second embodiment, only one single punch is used, facilitating the fabrication and saving much the fabrication time.

Figure 4:
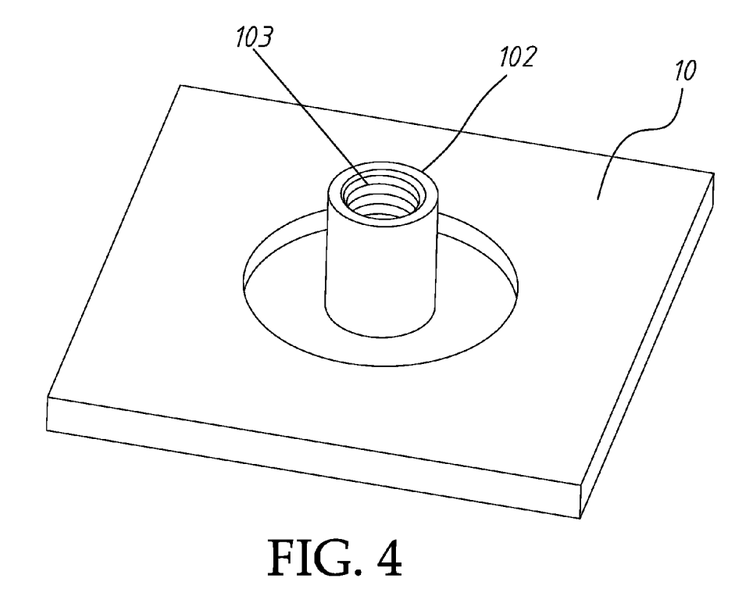
FIG. 4 corresponds to FIG. 3, showing an inner thread formed in the circular tenon.
Figure 5:
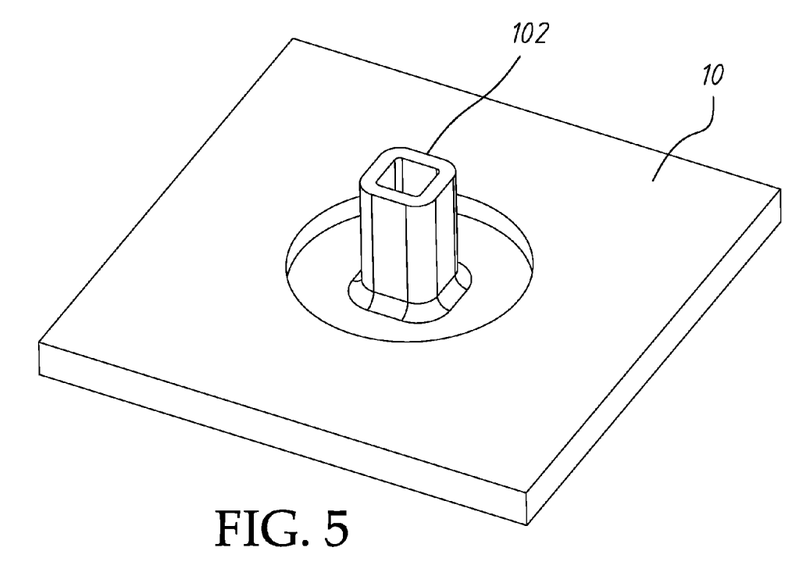
FIG. 5 is an elevational view, showing a non-circular tenon formed on one side of a metal plate member according to the present invention.

Further, the tenon 102 can be made in a circular shape (see FIG. 3), or a non-circular shape, for example, rectangular shape (see FIG. 5). Further, an inner thread 103 may be formed in the tenon 102 (see FIG. 4).

Figure 6:
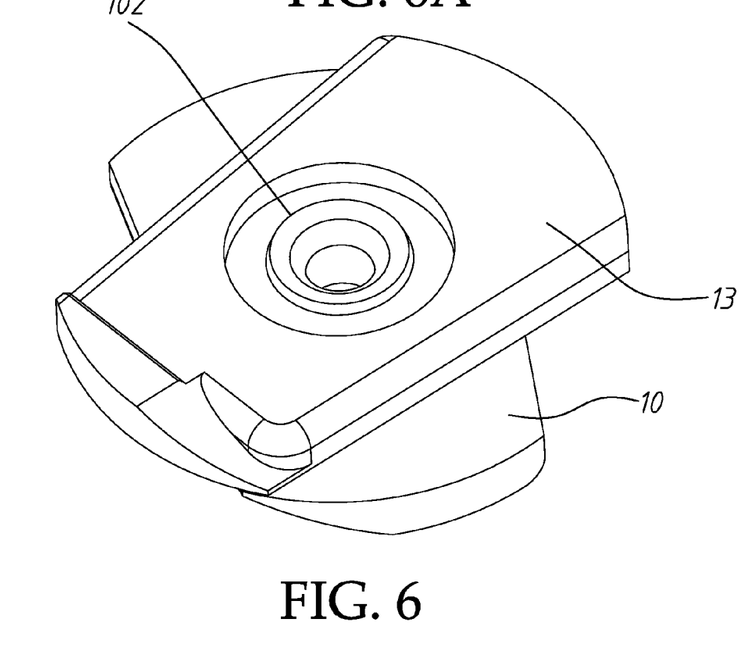
FIG. 6 illustrates the free end of the tenon hammered down and a swivel member pivotally coupled to the tenon of the metal plate member according to the present invention.
Figure 6A:
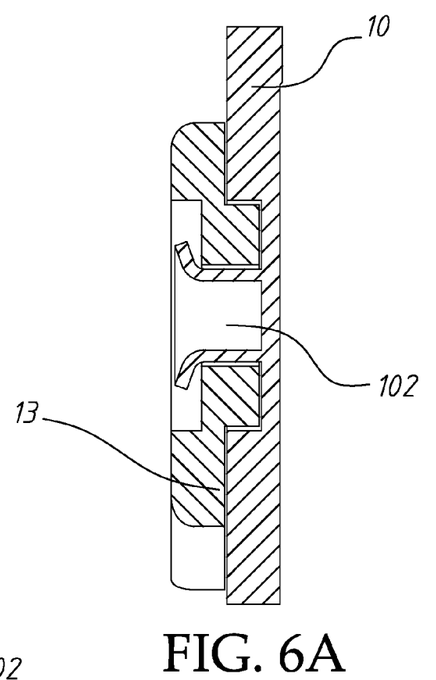
FIG. 6A is a sectional view of FIG. 6.

Referring to FIG. 6 and FIG. 6A, after insertion of the tenon 102 through a swivel member 13, the free end of the tenon 102 may be hammered down to form a head, enabling the swivel member 13 to be pivotally connected to the tenon 102.

When compared to the prior art tenon formation technique, a tenon made according to the invention has a relatively greater height, facilitating pivot connection of an external object or other design applications.

FIGS. 11~14 show an application example of the present invention in a mobile memory stick. As illustrated, the mobile memory stick 30 has an inverted U-shaped metal plate member 31 and a casing 32.

Figures 11, 11A:
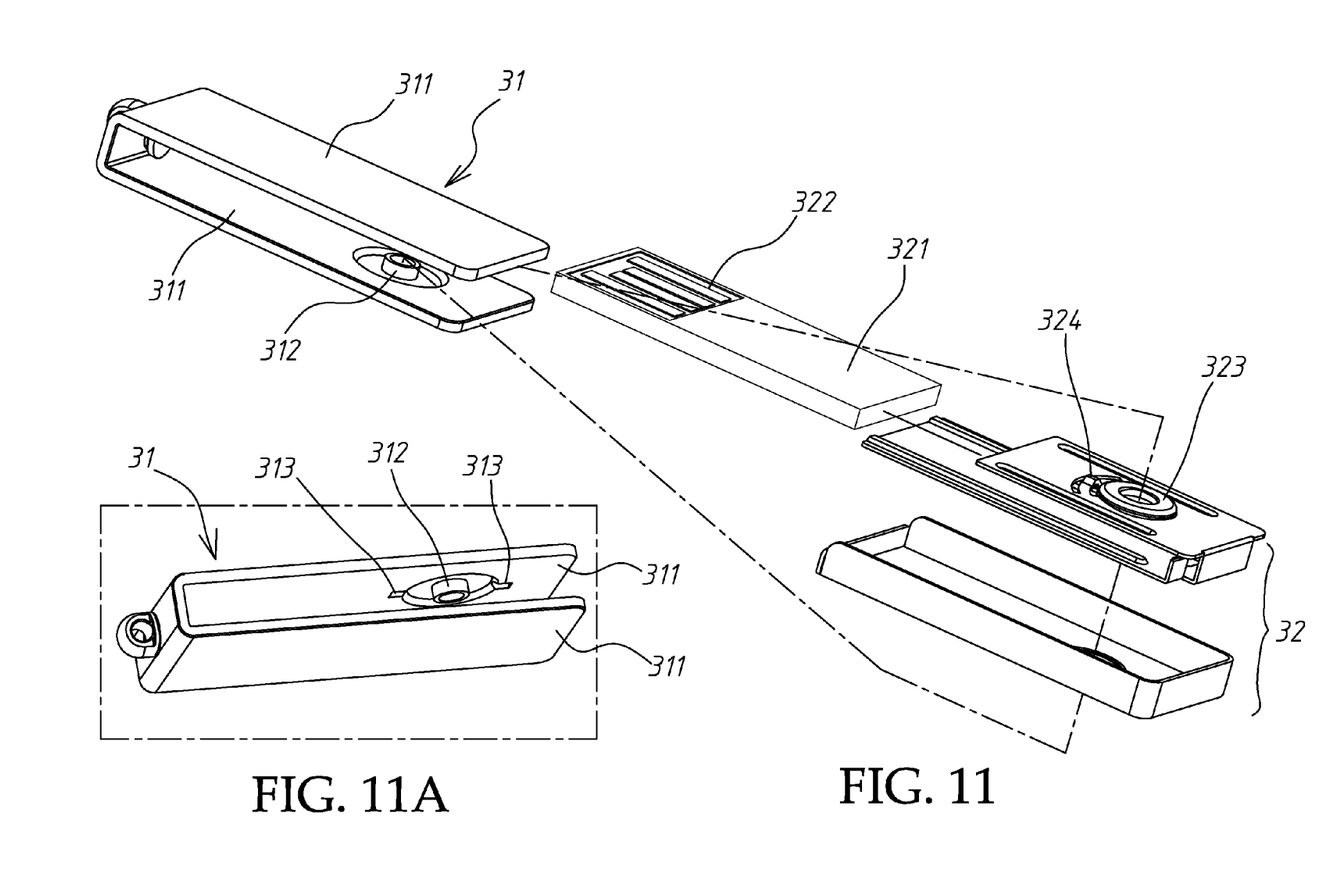
FIG. 11 is an exploded view of a mobile memory stick in accordance with the present invention.
FIG. 11A is a perspective view of the inverted U-shaped metal plate member shown in FIG. 7.

The inverted U-shaped metal plate member 31 has two tenones 312 respectively protruded from the inner wall thereof at two opposite sides and aimed at each other. The tenones 312 are formed on the inner wall of the inverted U-shaped metal plate member 31 subject to one of the aforesaid first and second embodiments of the present invention.

The casing 32 accommodates a PC board 321 having a USB connector 322 forwardly extended from its one end. The casing 32 is set in the inverted U-shaped metal plate member 31, having two pivot holders 323 symmetrically located on two opposite sides thereof and respectively pivotally coupled to the tenones 312 of the inverted U-shaped metal plate member 31 for enabling the inverted U-shaped metal plate member 31 to be turned relative to the casing 32 to close or open the USB connector 322.

The casing 32 of the mobile memory stick 30 further has a raised portion 324 disposed adjacent to each pivot holder 323. The inverted U-shaped metal plate member 31 has two locating grooves 313 symmetrically disposed at two opposite sides relative to each tenon 312 for selectively receiving the raised portions 324 of the casing 32.

When the inverted U-shaped metal plate member 31 is turned relative to the casing 32 to force the raised portion 324 adjacent to one pivot holder 323 into one of the two locating grooves 313 at two opposite sides relative to the associating tenon 312, the inverted U-shaped metal plate member 31 is locked to the casing 32 in the close position to shield the USB connector 322, as shown in FIG. 9.

Figure 12:
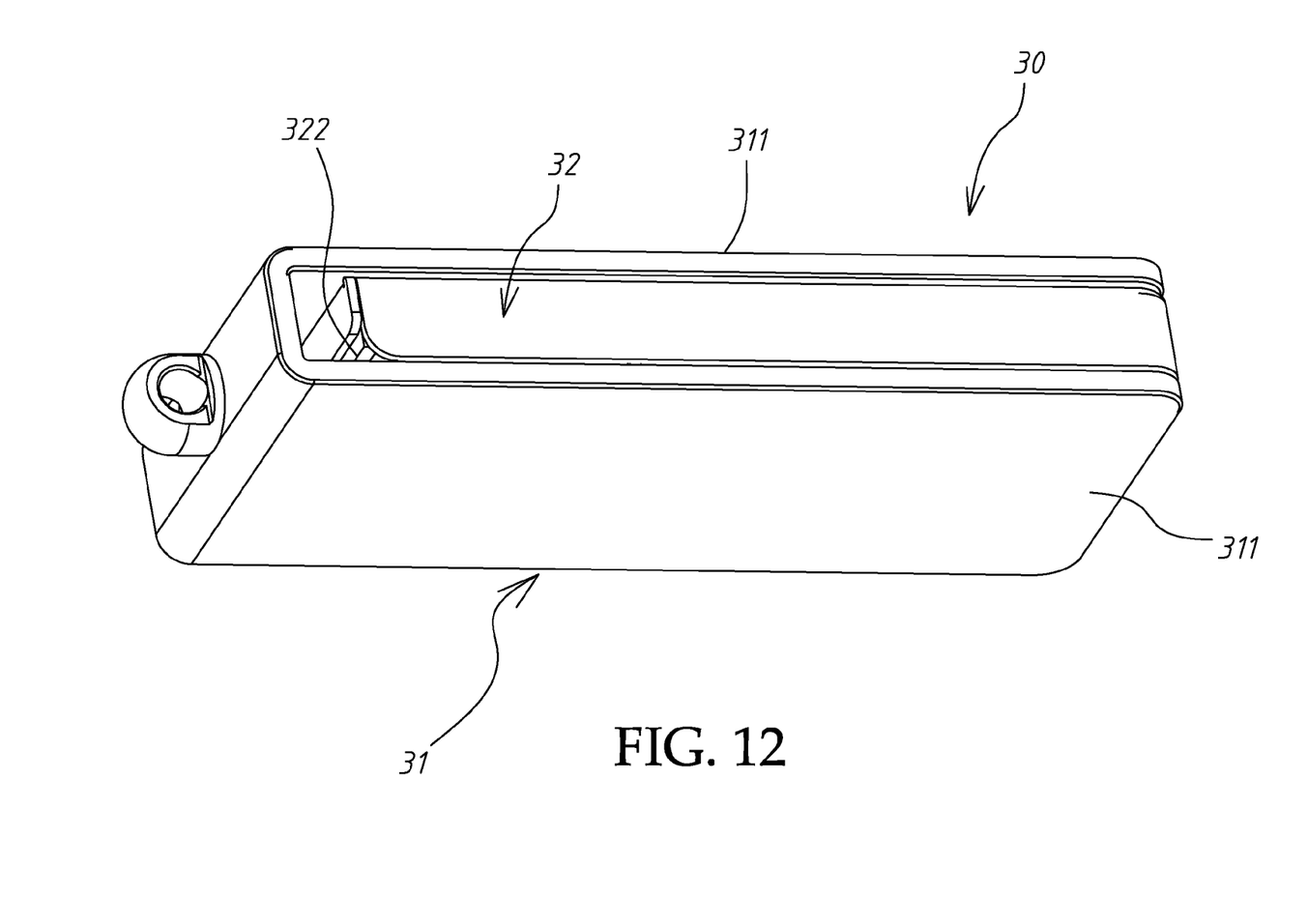
FIG. 12 is an elevational assembly view of the mobile memory stick in accordance with the present invention.

On the contrary, when the inverted U-shaped metal plate member 31 is turned relative to the casing 32 to force the raised portion 324 adjacent to one pivot holder 323 into the other one of the two locating grooves 313 at two opposite sides relative to the associating tenon 312, as shown in FIG. 12, the inverted U-shaped metal plate member 31 is locked to the casing 32 in the open position to have the USB connector 322 be exposed to the outside for insertion into a USB jack of a computer.

Figure 13:
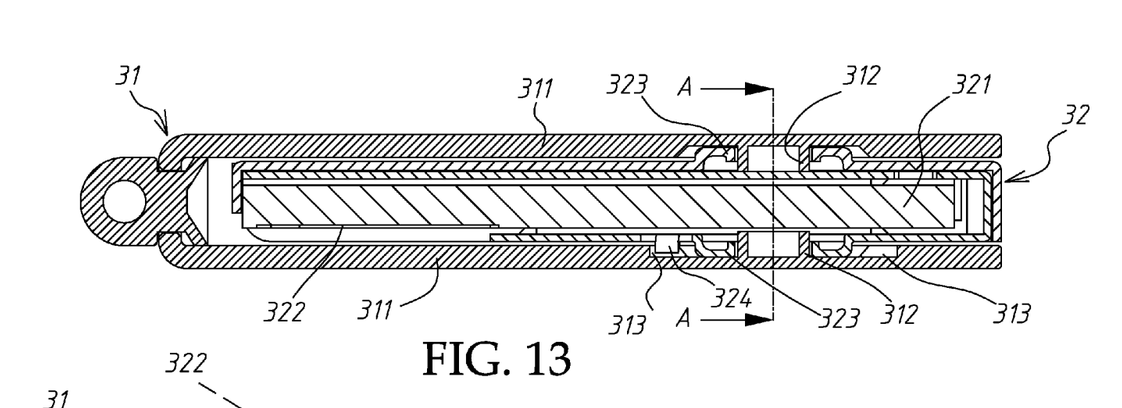
FIG. 13 is a sectional view of the mobile memory stick in accordance with the present invention.
Figure 14:
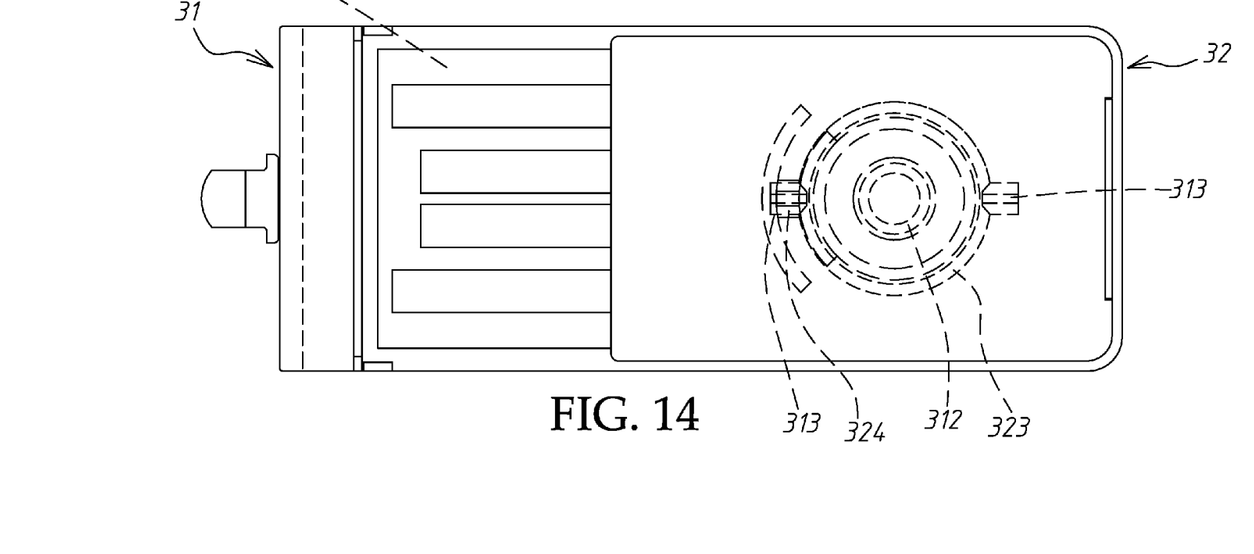
FIG. 14 is a plain view of the mobile memory stick in accordance with the present invention.

Referring to FIGS. 13 and 14, each tenon 312 of the inverted U-shaped metal plate member 31 of the mobile memory stick 30 is formed by means of punching the inner wall of the inverted U-shaped metal plate member 31 with a punch to form a protrusion and then punching the protrusion with a punch rod to extend the height and to make the protrusion into a tubular configuration. Subject of the application of the present invention, the height of the tenones 312 of the inverted U-shaped metal plate member 31 is greatly extended, so that the inverted U-shaped metal plate member 31 and the casing 32 can be accurately and pivotally secured together and biasing the inverted U-shaped metal plate member 31 relative to the casing 32 does not cause the casing 32 to fall from the inverted U-shaped metal plate member 31.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A method of forming a tenon on one side of a metal plate member, comprising the steps of:

a) providing a metal plate member having a top surface and a bottom surface each being a flat surface, outer edges defining a periphery of said metal plate member, and a thickness located between said top surface and said bottom surface, the top surface being parallel with the bottom surface;

b) providing a first punch having an outer step, an inner step perpendicularly protruded from said outer step and a first recess at the center of said inner step;

c) punching the top surface of said metal plate member with said first punch and driving said inner step into the wall of the top surface of said metal plate member, deforming a part of the wall of the top surface of said metal plate member and forming a groove having an outer peripheral wall corresponding to a shape of an exterior of said inner step of said first punch and forming a protrusion in said recess of said first punch, said groove of said metal plate member surrounding said protrusion and said groove and said protrusion are spaced apart from said outer edges of said metal plate member;

d) providing a second punch that is prepared subject to the configuration of the surface area of said metal plate member around said protrusion and has a second recess fitting said protrusion and a punch rod axially inserted through and movable up and down relative to said second recess; and e) punching said protrusion of said metal plate member with said second punch and said punch rod extending the height of said protrusion and making said protrusion into a tubular configuration and forming a tenon on the top side of said metal plate member, said tenon having a first end located below the top surface of said metal plate member and a second end protruding outwardly above the top surface of said metal plate member;

wherein, when said groove and said tenon have been formed by said punching step c) and said punching step e), except for the part of said top wall of said metal plate member where said groove and said tenon are located, said thickness of said metal plate is unchanged by said punching step c) and punching step e), a portion of said top surface surrounding said groove is unchanged by said punching step c) and punching step e), said bottom surface of said metal plate member is unchanged by said punching step c) and punching step e), and said outer periphery of said metal plate member is unchanged by said punching step c) and punching step e).

2. The method of forming a tenon on one side of a metal plate member as claimed in claim 1, wherein said tenon has a circular cross section.

3. The method of forming a tenon on one side of a metal plate member as claimed in claim 2, further comprising the step f) of tapping said tenon to form an inner thread therein.

4. The method of forming a tenon on one side of a metal plate member as claimed in claim 2, further comprising the step f) of inserting said tenon through a hole in a swivel member and then hammering down the free end of said tenon to form a head and to have said swivel member to be pivotally secured to said tenon.

5. The method of forming a tenon on one side of a metal plate member as claimed in claim 1, wherein said tenon has a non-circular cross section.

6. The method of forming a tenon on one side of a metal plate member as claimed in claim 5, wherein said tenon has a rectangular cross section.

7. A method of forming a tenon on one side of a metal plate member, comprising the steps of:

a) providing a metal plate member having a top surface and a bottom surface each being a flat surface, outer edges defining a periphery of said metal plate member, and a thickness located between said top surface and said bottom surface, the top surface being parallel with the bottom surface;

b) providing a punch having an outer step, an inner step perpendicularly protruded from said outer step, a recess disposed at the center of said inner step and a punch rod axially inserted through and movable up and down relative to said recess;

c) punching a top surface of said metal plate member with said punch and driving said inner step into the wall of the top surface of said metal plate member, deforming a part of the wall of the top surface of said metal plate member and forming a groove having an outer peripheral wall corresponding to a shape of an exterior of said inner step of said punch and forming a protrusion in said recess of said punch, said groove of said metal plate member surrounding said protrusion and said groove and said protrusion are spaced apart from said outer edges of said metal plate member; and d) punching said protrusion with said punch rod extending the height of said protrusion and making said protrusion into a tubular configuration and forming a tenon on the top surface of said metal plate member, said tenon having a first end located below the top surface of said metal plate member and a second end protruding outwardly above the top surface of said metal plate member;

wherein, when said groove and said tenon have been formed by said punching step c) and said punching step d), except for the part of said top wall of said metal plate member where said groove and said tenon are located, said thickness of said metal plate is unchanged by said punching step c) and punching step d), a portion of said top surface surrounding said groove is unchanged by said punching step c) and punching step d), said bottom surface of said metal plate member is unchanged by said punching step c) and punching step d), and said outer periphery of said metal plate member is unchanged by said punching step c) and punching step d).

8. The method of forming a tenon on one side of a metal plate member as claimed in claim 7, wherein said tenon has a circular cross section.

9. The method of forming a tenon on one side of a metal plate member as claimed in claim 8, further comprising the step e) of tapping said tenon to form an inner thread therein.

10. The method of forming a tenon on one side of a metal plate member as claimed in claim 8, further comprising the step e) of inserting said tenon through a hole in a swivel member and then hammering down the free end of said tenon to form a head and to have said swivel member to be pivotally secured to said tenon.

11. The method of forming a tenon on one side of a metal plate member as claimed in claim 7, wherein said tenon has a non-circular cross section.

12. The method of forming a tenon on one side of a metal plate member as claimed in claim 11, wherein said tenon has a rectangular cross section.

13. The method of forming a tenon on one side of a metal plate member as claimed in claim 1, wherein bottoms of said groove and an interior of said tenon of said metal plate member are located an equal distance below said top surface of said metal plate member.

14. The method of forming a tenon on one side of a metal plate member as claimed in claim 7, wherein bottoms of said groove and an interior of said tenon of said metal plate member are located an equal distance below said top surface of said metal plate member.

15. The method of forming a tenon on one side of a metal plate member as claimed in claim 1, wherein the outer peripheral wall of the groove is located adjacent and perpendicular to the top surface of the metal plate member.

16. The method of forming a tenon on one side of a metal plate member as claimed in claim 7, wherein the outer peripheral wall of the groove is located adjacent and perpendicular to the top surface of the metal plate member.

\* \* \* \* \*